US010283411B1

(12) United States Patent
Hook et al.

(10) Patent No.: US 10,283,411 B1
(45) Date of Patent: May 7, 2019

(54) STACKED VERTICAL TRANSISTOR DEVICE FOR THREE-DIMENSIONAL MONOLITHIC INTEGRATION

(71) Applicant: INTERNATIONAL BUSINESS MACHINES CORPORATION, Armonk, NY (US)

(72) Inventors: Terence B. Hook, Jericho, VT (US); Joshua Rubin, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/860,031

(22) Filed: Jan. 2, 2018

(51) Int. Cl.
| | |
|---|---|
| *H01L 29/06* | (2006.01) |
| *H01L 21/822* | (2006.01) |
| *H01L 21/762* | (2006.01) |
| *H01L 21/84* | (2006.01) |
| *H01L 27/11* | (2006.01) |
| *H01L 27/02* | (2006.01) |
| *H01L 27/06* | (2006.01) |
| *H01L 23/48* | (2006.01) |
| *H01L 21/8238* | (2006.01) |

(52) U.S. Cl.
CPC .... *H01L 21/8221* (2013.01); *H01L 21/76254* (2013.01); *H01L 21/823885* (2013.01); *H01L 21/845* (2013.01); *H01L 23/481* (2013.01); *H01L 27/0207* (2013.01); *H01L 27/0688* (2013.01); *H01L 27/1104* (2013.01)

(58) Field of Classification Search
CPC ............. H01L 21/8221; H01L 27/0688; H01L 21/823885
See application file for complete search history.

(56) References Cited

U.S. PATENT DOCUMENTS

| | | | |
|---|---|---|---|
| 5,308,782 A | 5/1994 | Mazure et al. | |
| 6,137,129 A * | 10/2000 | Bertin | ..................... H01L 27/11 257/135 |
| 6,426,530 B1 | 7/2002 | Bertin et al. | |
| 7,138,685 B2 | 11/2006 | Hsu et al. | |
| 7,190,031 B2 * | 3/2007 | Chakihara | ....... H01L 21/823885 257/365 |
| 7,495,289 B2 * | 2/2009 | Chakihara | ....... H01L 21/823885 257/365 |
| 7,799,675 B2 * | 9/2010 | Lee | ..................... H01L 21/2007 257/E23.145 |
| 7,892,956 B2 * | 2/2011 | Deligianni | ............. B82Y 10/00 257/E29.262 |

(Continued)

*Primary Examiner* — Victoria K. Hall
(74) *Attorney, Agent, or Firm* — Tutunjian & Bitetto, P.C.; Vazken Alexanian

(57) ABSTRACT

A first vertical transistor device associated with a first conductivity type is formed within a first tier. A second vertical transistor device associated with a second conductivity type is formed within a second tier. The first vertical transistor device is connected to the second vertical transistor device to create a stacked vertical transistor device for three-dimensional monolithic integration such that the first vertical transistor device is located below the second vertical transistor device within the stacked vertical transistor device. Connecting the first vertical transistor device to the second vertical transistor device includes forming interconnects from a top of the second tier to respective positions within the first tier by forming vias and filling the vias with interconnect material.

20 Claims, 12 Drawing Sheets

(56) References Cited

U.S. PATENT DOCUMENTS

| | | | | |
|---|---|---|---|---|
| 8,058,142 B2* | 11/2011 | Lee | H01L 21/2007 | 257/E23.145 |
| 8,071,438 B2* | 12/2011 | Lee | H01L 21/2007 | 257/E21.506 |
| 8,476,138 B2* | 7/2013 | Chakihara | H01L 21/823885 | 438/279 |
| 8,686,428 B1* | 4/2014 | Sekar | H01L 21/8221 | 257/173 |
| 9,012,292 B2* | 4/2015 | Lee | H01L 27/105 | 257/E21.09 |
| 9,202,788 B2 | 12/2015 | Okuno et al. | | |
| 9,342,650 B2 | 5/2016 | Liaw | | |
| 9,449,987 B1* | 9/2016 | Miyata | H01L 27/11582 | |
| 9,653,617 B2* | 5/2017 | Zhou | H01L 29/78696 | |
| 9,685,436 B2 | 6/2017 | Morrow et al. | | |
| 9,711,501 B1 | 7/2017 | Basker | H01L 27/0688 | |
| 9,812,574 B2 | 11/2017 | Pillarisetty et al. | | |
| 9,831,131 B1* | 11/2017 | Jacob | H01L 21/823807 | |
| 9,882,047 B2* | 1/2018 | Leobandung | H01L 29/0847 | |
| 9,997,413 B1* | 6/2018 | Leobandung | H01L 21/823487 | |
| 2001/0015450 A1* | 8/2001 | Sugibayashi | H01L 21/8221 | 365/51 |
| 2004/0012045 A1* | 1/2004 | Lee | H01L 21/8221 | 257/306 |
| 2004/0262635 A1* | 12/2004 | Lee | B82Y 10/00 | 257/199 |
| 2008/0048327 A1* | 2/2008 | Lee | G11C 5/02 | 257/758 |
| 2008/0224269 A1* | 9/2008 | Park | H01L 21/3221 | 257/617 |
| 2009/0026526 A1* | 1/2009 | Cho | H01L 21/8221 | 257/316 |
| 2009/0267233 A1* | 10/2009 | Lee | H01L 21/2007 | 257/758 |
| 2010/0038743 A1* | 2/2010 | Lee | H01L 21/2007 | 257/499 |
| 2010/0133695 A1* | 6/2010 | Lee | H01L 21/2007 | 257/773 |
| 2010/0190334 A1* | 7/2010 | Lee | H01L 21/2007 | 438/637 |
| 2011/0092030 A1* | 4/2011 | Or-Bach | G06F 17/5072 | 438/129 |
| 2012/0292614 A1* | 11/2012 | Matsubayashi | G11C 15/04 | 257/43 |
| 2015/0333056 A1* | 11/2015 | Du | H01L 23/528 | 257/773 |
| 2016/0197069 A1 | 7/2016 | Morrow et al. | | |
| 2017/0005106 A1* | 1/2017 | Zhang | H01L 29/42392 | |
| 2017/0117186 A1* | 4/2017 | Fenouillet-Beranger | H01L 21/76802 | |
| 2017/0358586 A1* | 12/2017 | Huynh Bao | H01L 29/0676 | |
| 2018/0096896 A1* | 4/2018 | Zhu | H01L 21/8221 | |
| 2018/0122846 A1* | 5/2018 | Roy | H01L 27/14609 | |
| 2018/0277442 A1* | 9/2018 | Leobandung | H01L 21/823487 | |

\* cited by examiner

US 10,283,411 B1

STACKED VERTICAL TRANSISTOR DEVICE FOR THREE-DIMENSIONAL MONOLITHIC INTEGRATION

BACKGROUND

Technical Field

The present invention generally relates to semiconductor devices, and more particularly to stacked vertical transistor devices for three-dimensional (3D) monolithic integration.

Description of the Related Art

Vertical transistors, such as vertical field-effect transistors (FETs), have been devised as a way to reduce contact poly pitch (CPP) to decrease unit cell size and increase efficiency by orienting current flow vertically. Vertical FETs reduce or eliminate parasitic capacitance and conductance from a substrate. Further, since the ohmic contacts and the channels are aligned vertically, contact density per unit of surface area of a vertical FET is higher than in a lateral FET.

SUMMARY

In accordance with an embodiment of the present invention, a method for fabricating a semiconductor device is provided. The method includes forming a vertical transistor device associated with a first conductivity type within a first tier, forming a second vertical transistor device associated with a second conductivity type within a second tier, and connecting the first vertical transistor device to the second vertical transistor device to create a stacked vertical transistor device for three-dimensional (3D) monolithic integration such that the first vertical transistor device is located below the second vertical transistor device within the stacked vertical transistor device. Connecting the first vertical transistor device to the second vertical transistor device includes forming interconnects from a top of the second tier to respective positions within the first tier by forming vias and filling the vias with interconnect material.

In accordance with another embodiment of the present invention, a method for fabricating a semiconductor device is provided. The method includes forming a vertical field-effect transistor (FET) device associated with a first conductivity type within a first tier, forming a second vertical FET tier associated with a second conductivity type within a second tier, and connecting the first vertical transistor device to the second vertical transistor device to create a stacked vertical transistor device for 3D monolithic integration such that the first vertical transistor device is located below the second vertical transistor device within the stacked vertical transistor device. Connecting the first vertical FET device to the second vertical transistor device includes forming interconnects from a top of the second tier to respective positions within the first tier by forming vias and filling the vias with interconnect material. The vias include a first via associated with a supply voltage extending to a doped region of the first vertical transistor device, a second via associated with a source/drain contact in the second tier extending to a first contact of the first vertical transistor device, and a third via associated with a gate contact in the second tier extending to a second contact of the first vertical transistor device.

In accordance with yet another embodiment of the present invention, a semiconductor device is provided. The device includes a stacked vertical transistor device for 3D monolithic integration. The stacked vertical transistor includes a first vertical transistor device associated with a first conductivity type formed within a first tier and a second vertical transistor device associated with a second conductivity type formed within a second tier such that the first vertical transistor device is located below the second vertical transistor device. The stacked vertical transistor device further includes a bonding layer bonding the first and second tiers, and interconnects including vias filled with interconnect material formed from a top of the second tier to respective positions within the first tier connecting the first vertical transistor device to the second vertical transistor device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
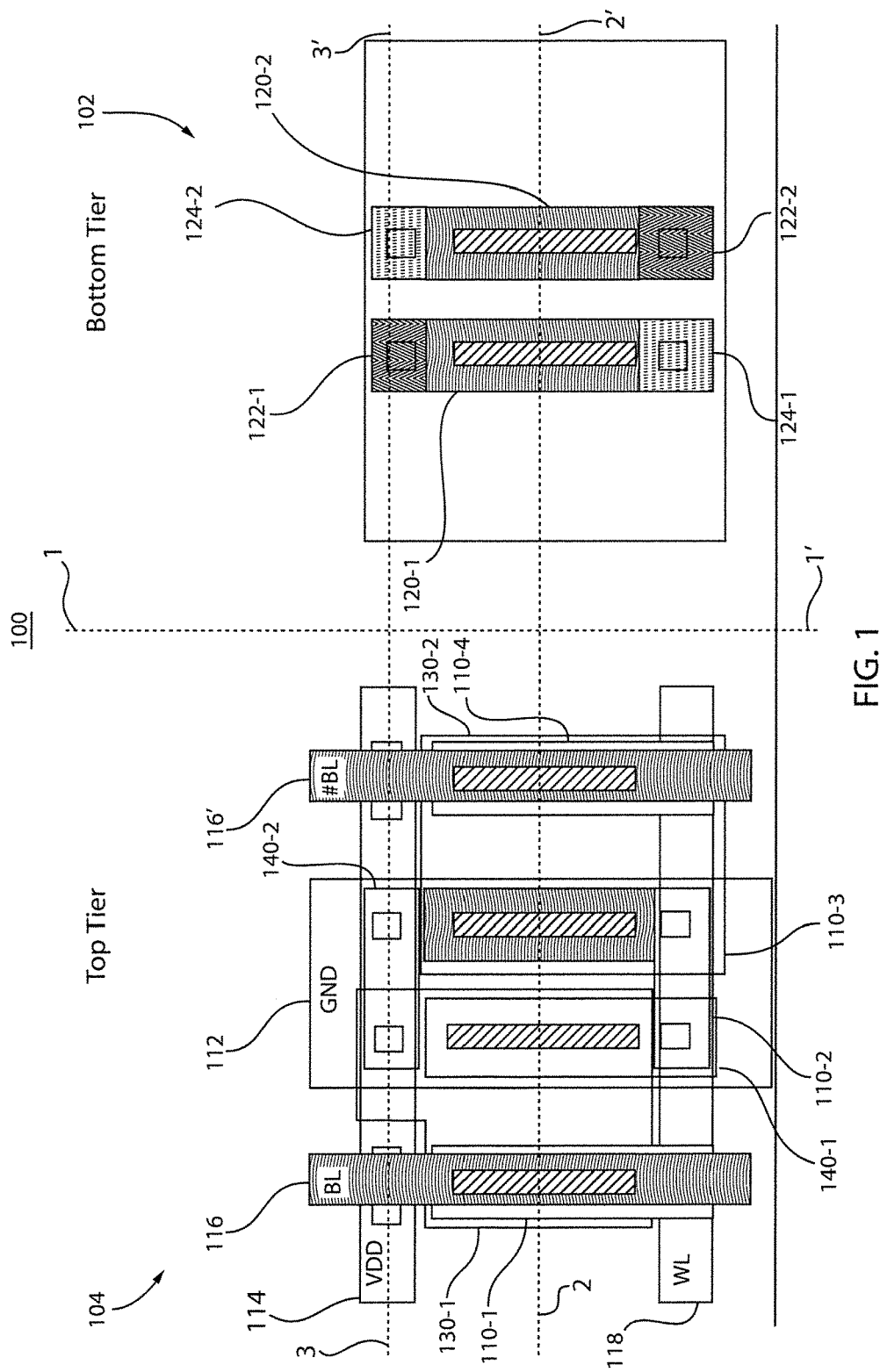
FIG. 1 is a top-down view showing both a top tier and a bottom tier of a semiconductor device, in accordance with an embodiment of the present invention.

Three-dimensional (3D) monolithic integration generally allows for the vertical stacking of devices on a single die to reduce die area and increase die performance. More specifically, 3D monolithic integration methods generally allow for components of the devices and their connections to be built within multiple tiers on a single die.

Embodiments of the present invention provide for stacked vertical transistor memory cells, such as stacked vertical field-effect transistor (FET) memory cells, that may be used for 3D monolithic integration.

A stacked vertical transistor memory cell appropriate for 3D monolithic integration formed in accordance with the embodiments described herein includes a top tier and a bottom tier each having respective FET devices. In one embodiment, the top tier includes a vertical transistor device including n-type vertical transistors (e.g., nFETs) and the bottom tier includes a vertical transistor device including p-type vertical transistors (e.g., pFETs). For example, in the illustrative 6T SRAM cell embodiment discussed herein, the top tier includes four nFETs and the bottom tier includes two pFETs. However, such embodiments are not limiting. For example, in an alternative embodiment, the top tier includes p-type vertical transistors and the bottom tier includes n-type vertical transistors.

In accordance with aspects of the present invention, the integration of the stacked vertical transistor devices within the 3D monolithic scheme provides a variety of benefits, such as with respect to logic. For example, one or more of the following benefits can be realized: (1) heterogeneous integration where temperature cycles may ideally be different; (2) tighter packing of circuits so that back-end-of-the-line (BEOL) wire length is reduced for power and performance benefit; and (3) higher drive strength in a given areal footprint.

Exemplary applications/uses to which the present invention can be applied include, but are not limited to, fabricating memory devices. For example, embodiments of the present invention can be applied to the fabrication of a static random-access memory (SRAM) device formed from SRAM cells. As is known in the art, an SRAM cell is composed of transistors, which can include metal-oxide-semiconductor FETs (MOSFETs). For example, in a six transistor SRAM cell (i.e., a 6T SRAM cell), each bit is stored on four transistors that form cross-coupled inverters, and the other two transistors are access transistors that control access to a storage cell during read and write operations.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIGS. 1-4, and FIGS. 5-11 depict respective steps of a process flow for fabricating a stacked vertical transistor memory cell appropriate for 3D monolithic integration.

FIG. 1 depicts a top-down view of a semiconductor device 100. Lines 1-1', 2-2' and 3-3' are provided in FIG. 1. Due to the stacked structure of the semiconductor device discussed herein, reference to lines 1-1' through 3-3' will be made throughout the Figures to aid in the visualization of the illustrative embodiments of the present invention. Line 1-1' corresponds to an imaginary line separating a bottom tier 102 of the device 100 and a top tier 104 of the device 100. Line 2-2' corresponds to an imaginary line passing through substantially the middle of the device 100. FIGS. 2 and 4-7 provided herein are cross-sectional views of the device taken at line 2-2'. Line 3-3' corresponds to an imaginary line passing through a supply voltage line 114. FIGS. 3 and 8-11 provided herein are cross-sectional views of the device taken at line 3-3'.

As shown, the semiconductor device 100 is composed of a bottom tier 102 and a top tier 104.

The top tier 104 includes one or more vertical transistor devices associated with a first conductivity type and the bottom tier 102 includes one or more vertical transistor devices associated with a second conductivity type. For example, as shown in this illustrative embodiment, the top tier 104 includes four vertical transistor devices, including vertical transistor devices 110-1 through 110-4, and the bottom tier 102 includes two vertical transistor devices, including vertical transistor devices 120-1 and 120-2. Thus, the device 100 in this illustrative embodiment is a six transistor (6T) device. In one embodiment, the vertical transistor devices include vertical field-effect transistor (FET) devices.

The top tier 104 includes a ground (GND) line 112, a supply voltage (VDD) line 114, a bit-line (BL) 116, a complementary BL (#BL) 116' and a word-line (WL) 118.

The vertical transistor devices 110-1 through 110-4 are illustratively associated with a n-type conductivity (e.g., nFET devices) and the vertical transistor devices 120-1 and 120-2 are illustratively associated with a p-type conductivity (e.g., pFET devices) because GND line 112, BL 116, #BL 116' and WL 118 are associated with n-type conductivity devices. However, in alternative arrangements, the top tier 104 could include p-type vertical transistor devices and the bottom tier 102 could include n-type vertical transistor devices (e.g., by flipping polarities for a p-type vertical transistor passgate design).

Vertical transistor devices device 120-1 is shown including source/drain contact 122-1 and gate contact 124-1, and vertical transistor device 120-2 is shown including source/drain contact 122-2 and gate contact 124-2. The source/drain contact 122-1 is connected to the active area or region 130-1 of the top tier 104. The gate contact 124-2 is connected to gate contact 140-2 in the top tier 104. The source/drain contact 122-2 is connected to the active area or region 130-2 of the top tier 104.

In one embodiment, the device 100 is a memory cell, such as a static random-access memory (SRAM) cell. For example, the SRAM cell may be a 6T SRAM cell. In this illustrative embodiment, the device includes four transistors in the top tier 104 and two transistors in the bottom tier 102. However, such an embodiment is not limiting.

Figure 2:
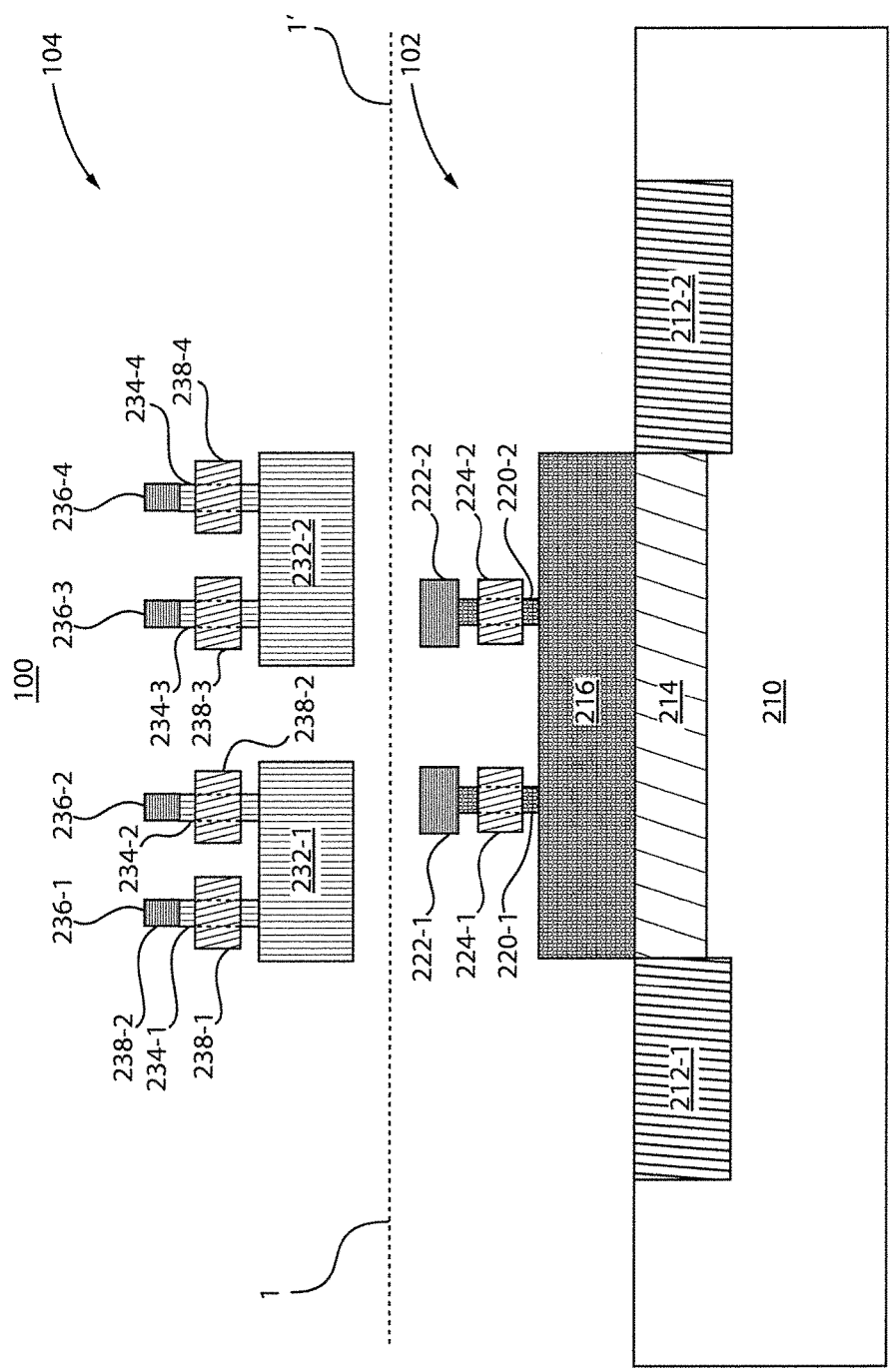
FIG. 2 is a cross-sectional view showing the semiconductor device of FIG. 1 at a cross-section about the middle of the semiconductor device, in accordance with an embodiment of the present invention.

FIG. 2 depicts a cross-section through a middle of a semiconductor device, such as a cross-section of the device 100 through line 2-2' in FIG. 1, up to but not including the bit line, the word line, and the power supply wiring.

The bottom tier 102 includes a device composed of vertical transistor devices. In one embodiment, the device of the bottom tier 102 includes p-type vertical transistor devices (e.g., pFETs) formed on substrate 210. The substrate 210 can include any suitable substrate structure, e.g., a bulk semiconductor, a semiconductor-on-insulator (SOI) substrate, etc. In one example, the substrate 210 can include a silicon-containing material. Illustrative examples of Si-containing materials suitable for the substrate 210 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The device in the bottom tier 102 further includes shallow trench isolation (STI) regions 212-1 and 212-2. The STI regions 212-1 and 212-2 can be formed by etching trenches in the substrate 210, and filling the trenches with a dielectric material, such as silicon dioxide ($SiO_2$). The etching can utilize an etching process such as reactive-ion etching (RIE) or plasma etching. After the etching, the trenches can then be optionally lined with a liner material, e.g., an oxide, prior to filling the trenches with the STI material using a suitable deposition process (e.g., chemical vapor deposition or CVD). A planarization process such as chemical-mechanical polishing (CMP) can optionally be employed after the filling to provide a planar structure.

The device in the bottom tier 102 includes a well 214 that includes a doped semiconductor material having a corresponding conductivity type. The well 214 can be formed by utilizing a well doping process. The well doping process can utilize ion implantation. The well 214 can have any doping concentration in accordance with the embodiments described herein.

The device in the bottom tier 102 further includes a doped region 216 formed on the well 214. The doped region 216 includes a doped semiconductor material having a corresponding conductivity type. The doped region 216 can have any doping concentration in accordance with the embodiments described herein.

In this illustrative embodiment, since the device in the bottom tier 102 includes p-type vertical transistors, the doped region 216 includes p-type material while the well 214 includes n-type material.

The device in the bottom tier 102 further includes a plurality of fins, including fins 220-1 and 220-2 formed on the doped region 216. The fins 220-1 and 220-2 can be composed of any material suitable for use as semiconductor fins in accordance with the embodiments described herein, and can be formed using one or more processes, such as photolithography and/or etch processes. The dimensions of the fins 220-1 and 220-2 can be chosen based on current capabilities.

The device in the bottom tier 102 further includes a plurality contacts formed about the fins 220-1 and 220-2. For example, as shown, contacts 222-1 and 224-1 are formed on fin 220-1, and contacts 222-2 and 224-2 are formed on fin 220-2. Contacts 222-1 and 222-2 are source/drain contacts, and contacts 224-1 and 224-2 are electrical contacts to gates.

The device in the top tier 104 includes doped regions 232-1 and 232-2, respectively. The doped regions 232-1 and 232-2 can have any doping concentration in accordance with the embodiments described herein. In one embodiment, the doped regions 232-1 and 232-2 are heavily doped. In this illustrative embodiment, since the top tier 104 includes n-type semiconductor devices (e.g., nFETs), the doped regions 232-1 and 232-2 include n-type material.

The device in the top tier 104 further includes a plurality of fins, including fins 234-1 and 234-2 formed on the doped region 232-1 and fins 234-3 and 234-4 formed on the doped region 232-2. The fins 234-1 through 234-4 can be composed of any material suitable for use as semiconductor fins in accordance with the embodiments described herein, and can be formed using one or more processes, such as photolithography and/or etch processes. The dimensions of the fins 234-1 through 234-4 can be chosen based on current capabilities.

The device in the top tier 104 further includes a plurality of contacts formed about the fins 234-1 through 234-4. For example, as shown, contacts 236-1 through 236-4 are formed about the fins 234-1 through 234-4, respectively. Contact 236-1 can be a source/drain contact associated with a BL, contact 236-2 can be a source/drain contact associated with a GND line, contact 236-3 can be a source/drain contact associated with a GND line, and contact 236-4 can be a source/drain contact associated with a #BL. As further shown, contacts 238-1 through 238-4 are formed about the fins 234-1 through 234-4, respectively. Contacts 238-1 through 238-4 are electrical contacts to gates.

Figure 3:
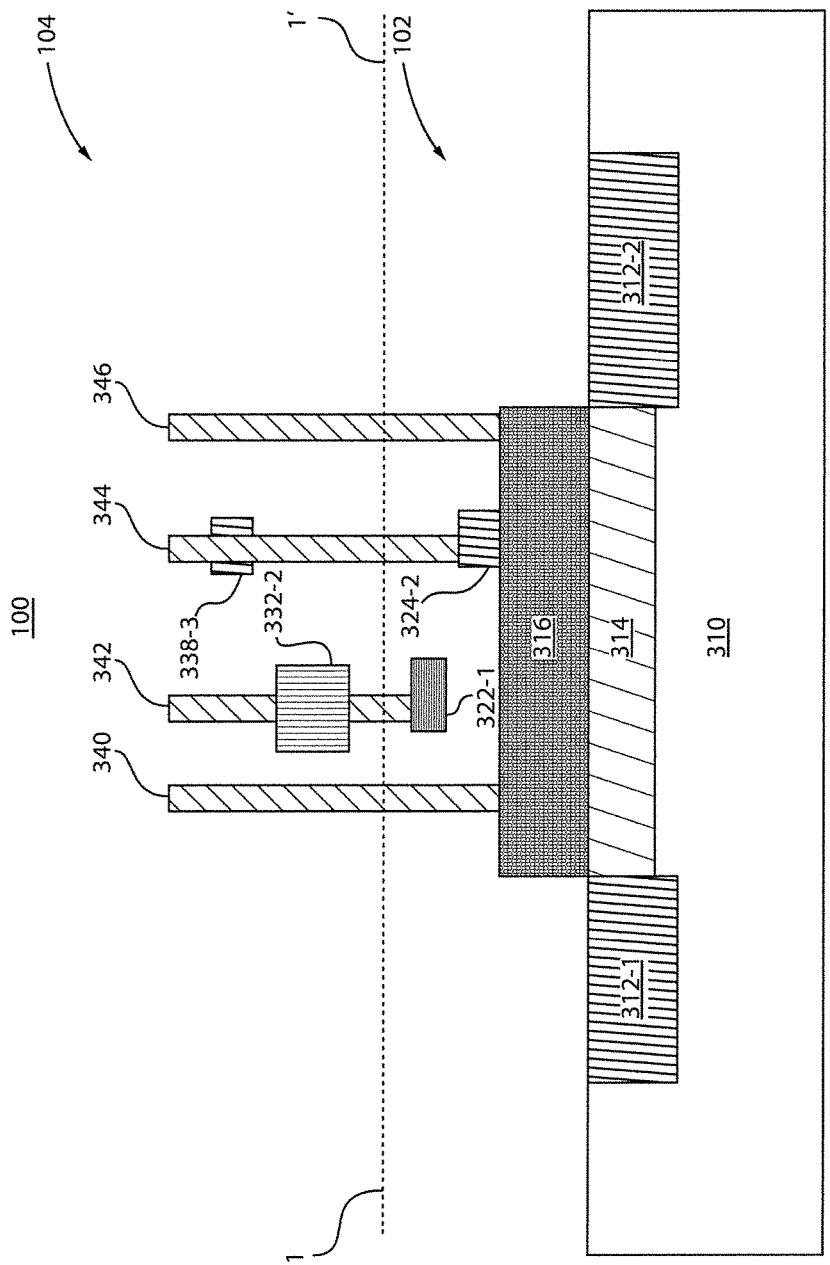
FIG. 3 is a cross-sectional view showing the semiconductor device of FIG. 1 at a cross-section through a supply voltage line, in accordance with an embodiment of the present invention.

FIG. 3 depicts a cross-section through a supply voltage of a device, such as a cross-section of the device 100 through line 3-3' in FIG. 1, up to but not including the bit line, the word line, and the power supply wiring.

The bottom tier 102 includes device having a substrate 310, STI regions 312-1 and 312-2, a well 314, a doped region 316, source/drain contact 322-1 and electrical contact to gate 324-2, which are similar to the substrate 210, STI regions 212-1 and 212-2, the well 214, the doped region 216, source/drain contact 222-1 and electrical contact to gate 224-2 of FIG. 2, respectively.

The top tier 104 includes a device having a doped region 332-2 and a contact 338-3, which are similar to the doped region 232-2 and the contact 238-3 of FIG. 2, respectively.

As further shown in FIG. 3, interconnects 340-346 are formed to connect the device in the top tier 104 to the device in the bottom tier. Interconnects 340 and 346 can be associated with the VDD contact, and interconnects 342 and 344 can be associated with the cross-coupling. The interconnects 340-346 can be formed by employing one or more etching processes, and filling the vias with material suitable for use as interconnect material, in accordance with the embodiment described herein.

As shown, the interconnects 340-346 are formed from a top of the top tier 104 to respective positions within the bottom tier 102. In one embodiment, and as shown, the interconnects 340 and 346 each extend to the doped region 316, the interconnect 342 extends to the contact 322-1, and the interconnect 344 extends to the contact 324-2. The interconnect 342 is further shown being formed through doped region 332-2, and the interconnect 344 is further shown being formed through the contact 338-3.

Referring now to the drawings in which like numerals represent the same or similar elements and initially to FIG. 4, FIGS. 4-11 depict respective steps of a process flow for fabricating a semiconductor device 400 for 3D monolithic integration. The device 400 is a stacked vertical transistor device that, in one embodiment, can be embodied as a memory cell (e.g., an SRAM cell).

As mentioned in FIG. 1, FIGS. 4-7 are shown from the perspective of a cross-section through around the middle of the device 400 (corresponding to line 2-2' in FIG. 1), while FIGS. 8-11 of the process are shown from the perspective of a cross-section through a supply voltage of the device 400 (corresponding to line 3-3' in FIG. 1).

Figure 4:
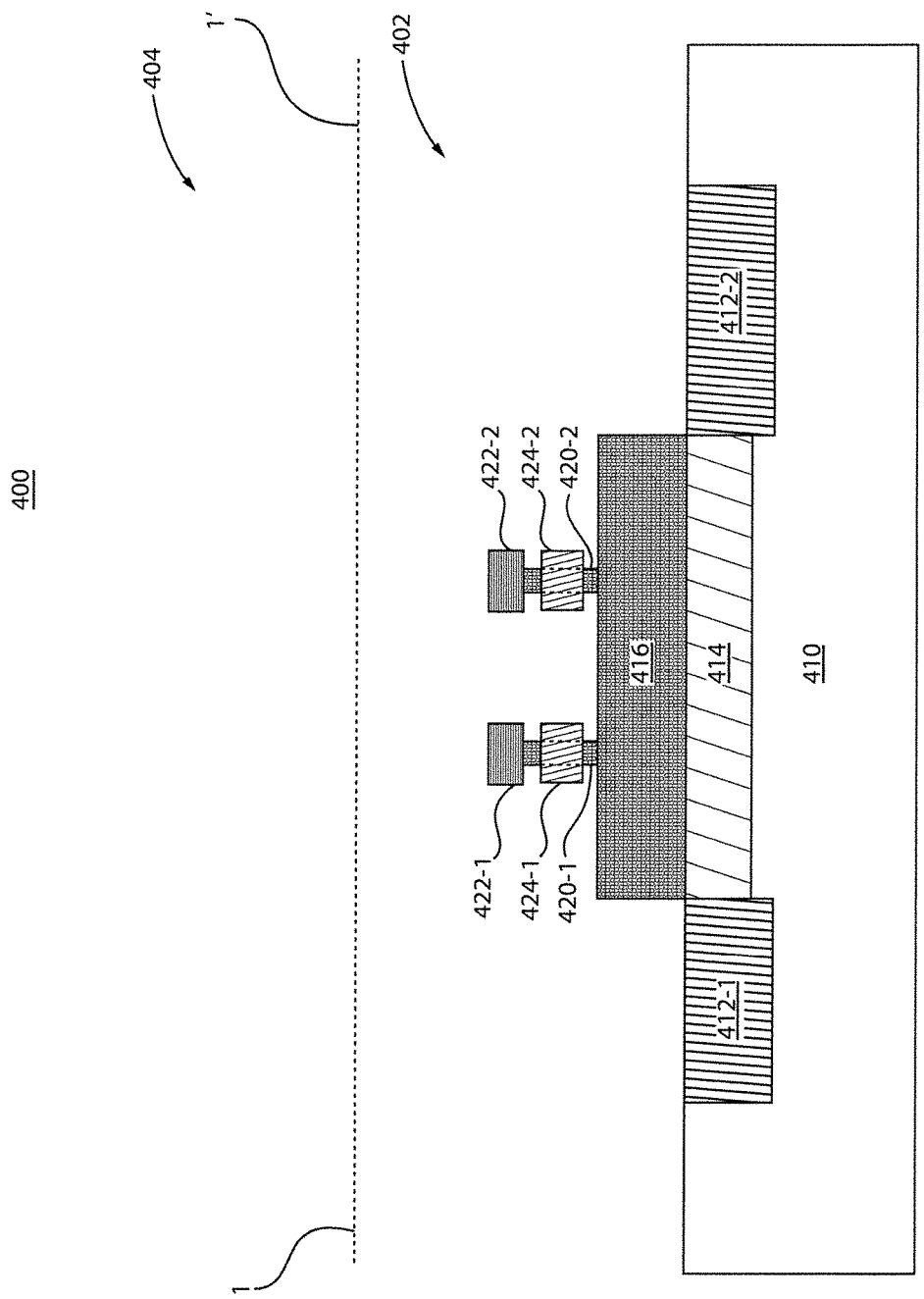
FIG. 4 is a cross-sectional view showing the fabrication of a semiconductor device, in accordance with an embodiment of the present invention.

With reference to FIG. 4, a vertical transistor device is formed in a bottom tier 402 of the device 400. As shown, the vertical transistor device of the bottom tier 402 includes a substrate 410. The substrate 410 can include any suitable substrate structure, e.g., a bulk semiconductor, a semiconductor-on-insulator (SOI) substrate, etc. In one example, the substrate 410 can include a silicon-containing material. Illustrative examples of Si-containing materials suitable for the substrate 410 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The vertical transistor device of the bottom tier 402 further includes STI regions 412-1 and 412-2. The STI regions 412-1 and 412-2 can be formed by etching trenches in the substrate 410, and filling the trenches with a dielectric material, such as $SiO_2$. The etching can utilize an etching process such as RIE or plasma etching. After the etching, the trenches can then be optionally lined with a liner material, e.g., an oxide, prior to filling the trenches with the STI material using a suitable deposition process (e.g., CVD). A planarization process such as CMP can optionally be employed after the filling to provide a planar structure.

The vertical transistor device of the bottom tier 402 further includes a well 414 that includes a doped semiconductor material having a corresponding conductivity type.

The well 414 can be formed by utilizing a well doping process. The well doping process can utilize ion implantation. The well 414 can have any doping concentration in accordance with the embodiments described herein.

The vertical transistor device of the bottom tier 402 further includes a doped region 416 formed on the well 414. The doped region 416 includes a doped semiconductor material having a corresponding conductivity type. The doped region 416 can have any doping concentration in accordance with the embodiments described herein.

In this illustrative embodiment, the vertical transistor device of the bottom tier 402 includes p-type semiconductor devices (e.g., pFETs). Thus, the doped region 416 in this embodiment is formed from p-type material while the well 414 in this embodiment is formed from n-type material.

The vertical transistor device of the bottom tier 402 further includes a plurality of fins, including fins 420-1 and 420-2 formed on the doped region 416. The fins 420-1 and 420-2 can be composed of any material suitable for use as semiconductor fins in accordance with the embodiments described herein, and can be formed using one or more processes, such as photolithography and/or etch processes. The dimensions of the fins 420-1 and 420-2 can be chosen based on current capabilities.

The vertical transistor device of the bottom tier 402 further includes a plurality of contacts formed about the fins 420-1 and 420-2. For example, as shown, source/drain contacts 422-1 and 422-2 are formed on fins 420-1 and 420-2, respectively, and electrical contacts to gates 424-1 and 424-2 are formed about the fins 420-1 and 420-2, respectively.

Figure 5:
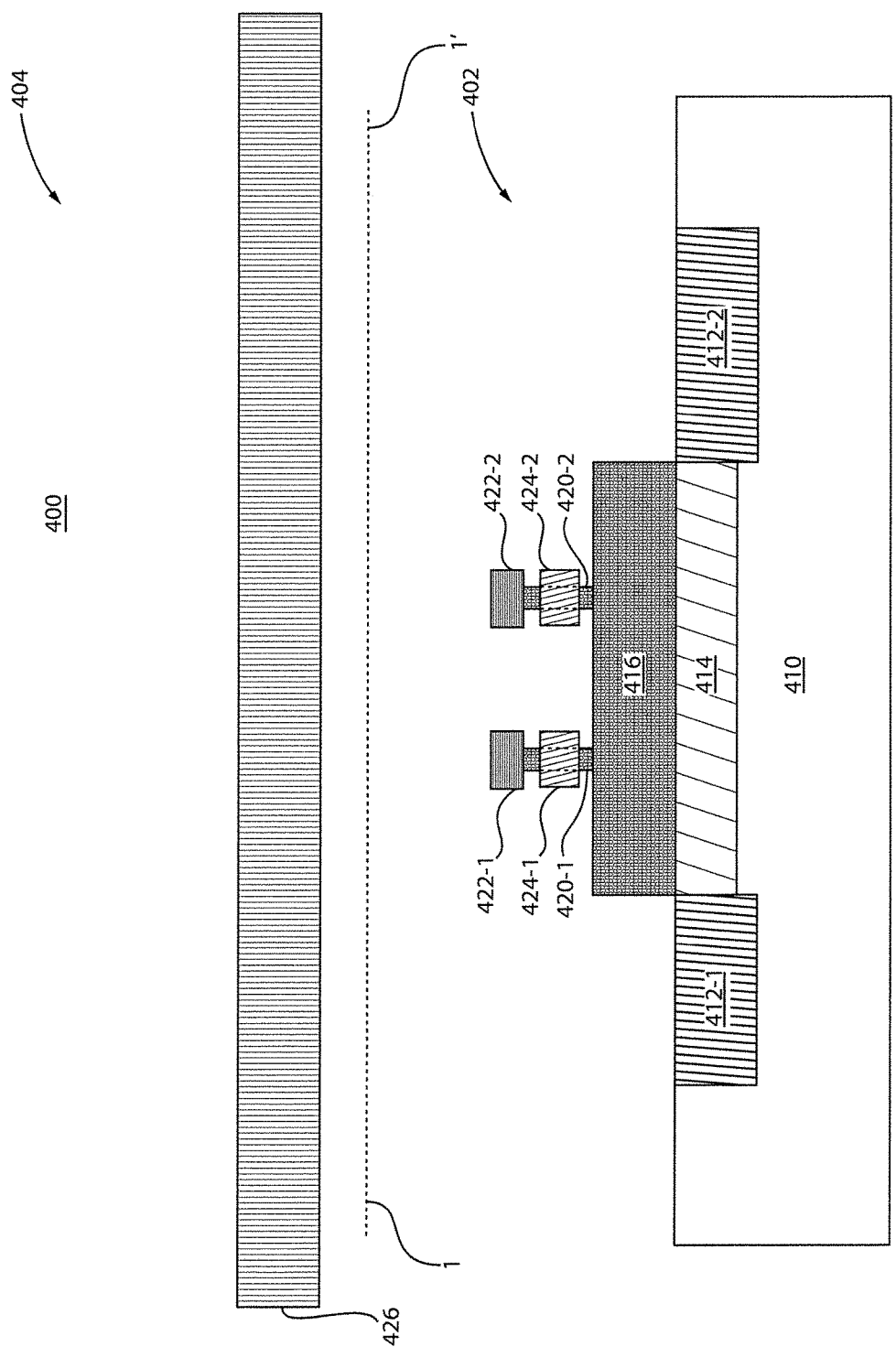
FIG. 5 is a cross-sectional view showing the fabrication of a semiconductor device, in accordance with an embodiment of the present invention.

With reference to FIG. 5, a bonding layer 426 is formed. The bonding layer 426 is used to bond the bottom tier 402 with the top tier 404. The bonding layer 426 can be formed by depositing material suitable for use as bonding material, and planarizing the deposited material. For example, the material can be any dielectric material suitable for use in accordance with the embodiments described herein (e.g., $SiO_2$). The bonding layer 426 could include one or more layers.

Figure 6:
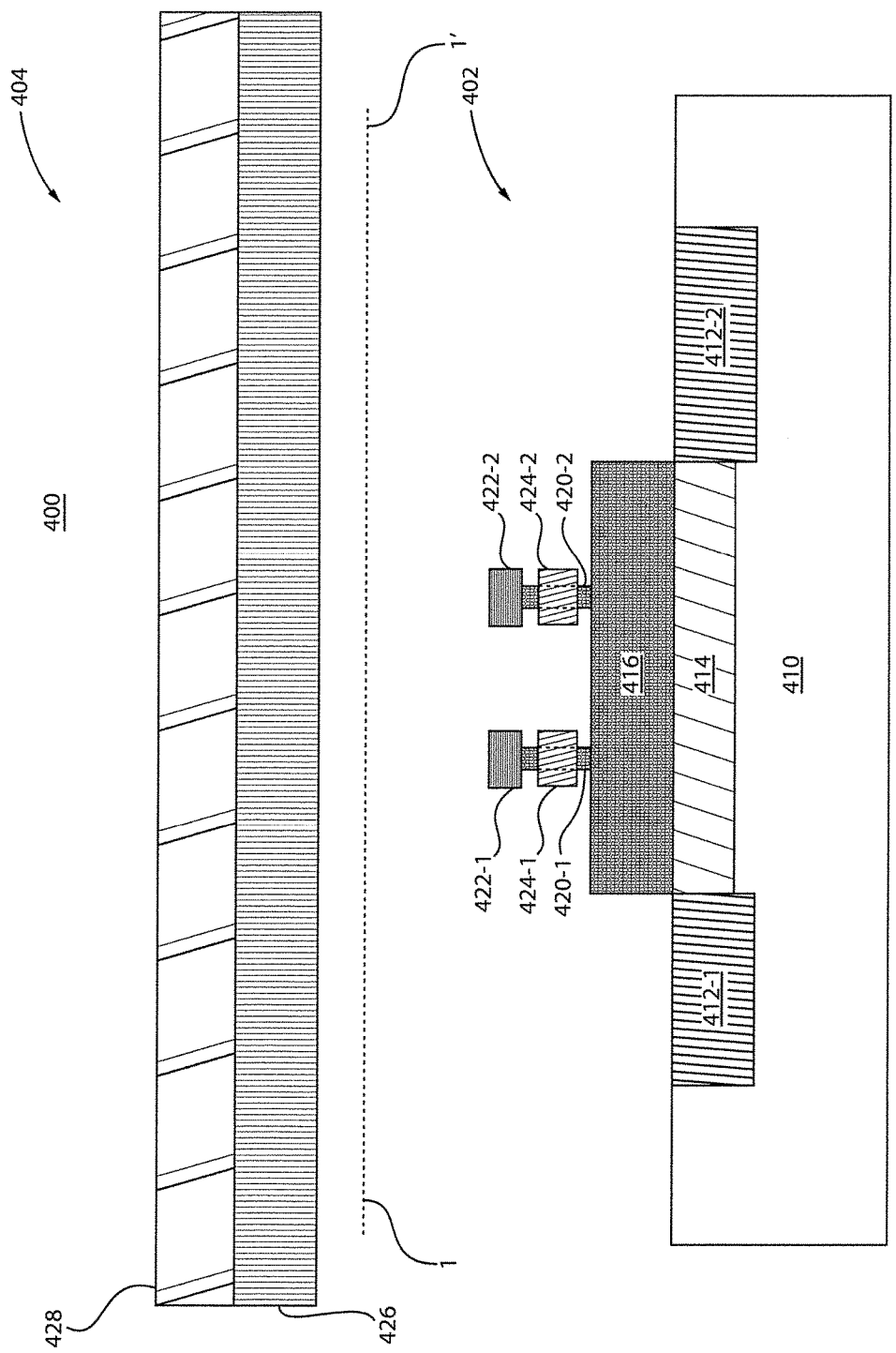
FIG. 6 is cross-sectional view showing the fabrication of a semiconductor device, in accordance with an embodiment of the present invention.

With reference to FIG. 6, a separately formed monocrystalline layer 428 can optionally be bonded to the bonding layer 426. The monocrystalline layer 428 can be undoped, and can be formed via epitaxial growth and/or implantation. Epitaxial growth refers to the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial growth process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material, such as epitaxial layer 428, has substantially the same crystalline characteristics as the deposition surface on which the epitaxially grown material is formed. For example, an epitaxially grown semiconductor material deposited on a {100} orientated crystalline surface will take on a {100} orientation.

One way this can be done is as follows. The bottom tier 402 can have some bonding films deposited on it (which can be planarized), and then another wafer with bonding films can then be attached to the deposited bonding films. A layer of silicon or other semiconductor can then be transferred utilizing any means suitable in accordance with the embodiments described herein. The wafer that is used to transfer silicon can first be implanted with hydrogen to create a hydrogen implanted region, and the hydrogen implanted region can be cleaved after bonding via annealing (e.g., a smart cut technological process). The wafer used to transfer silicon could still have epitaxially grown films, etc.

Figure 7:
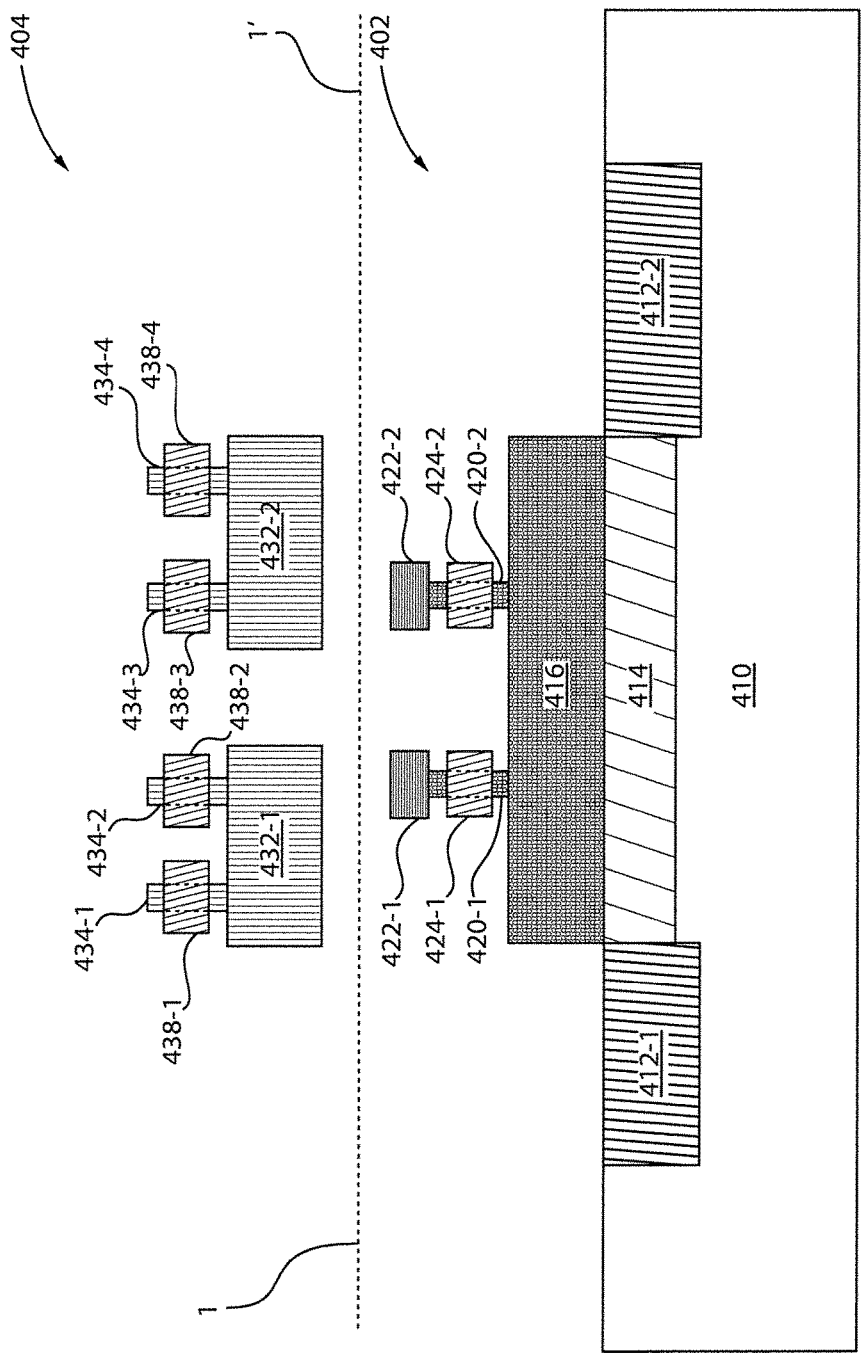
FIG. 7 is a cross-sectional view showing the fabrication of a semiconductor device, in accordance with an embodiment of the present invention.

With reference to FIG. 7, a vertical transistor device is formed in the top tier 404. The vertical transistor device of the top tier 404 includes doped regions 432-1 and 432-2, respectively. The doped regions 432-1 and 432-2 can have any doping concentration in accordance with the embodiments described herein. In this illustrative embodiment, the vertical transistor device of the top tier 404 includes n-type semiconductor devices (e.g., nFETs). Thus, the doped regions 432-1, 432-2 in this embodiment is formed from n-type material.

The vertical transistor device of the top tier 404 further includes a plurality of fins, including fins 434-1 and 434-2 formed on the doped region 432-1 and fins 434-3 and 434-4 formed on the doped region 432-2. The fins 434-1 through 434-4 can be composed of any material suitable for use as semiconductor fins in accordance with the embodiments described herein, and can be formed using one or more processes, such as photolithography and/or etch processes. The dimensions of the fins 434-1 through 434-4 can be chosen based on current capabilities.

The vertical transistor device of the top tier 404 further includes a plurality contacts formed about the fins 434-1 and 434-2. For example, as shown, electrical contacts to gates 438-1 through 438-4 are formed about the fins 434-1 through 434-4, respectively.

The vertical transistor device of the top tier 404 may be formed utilizing any processes in accordance with the embodiments described herein. Thermal cycles as per general monolithic requirements are limited.

Figure 8:
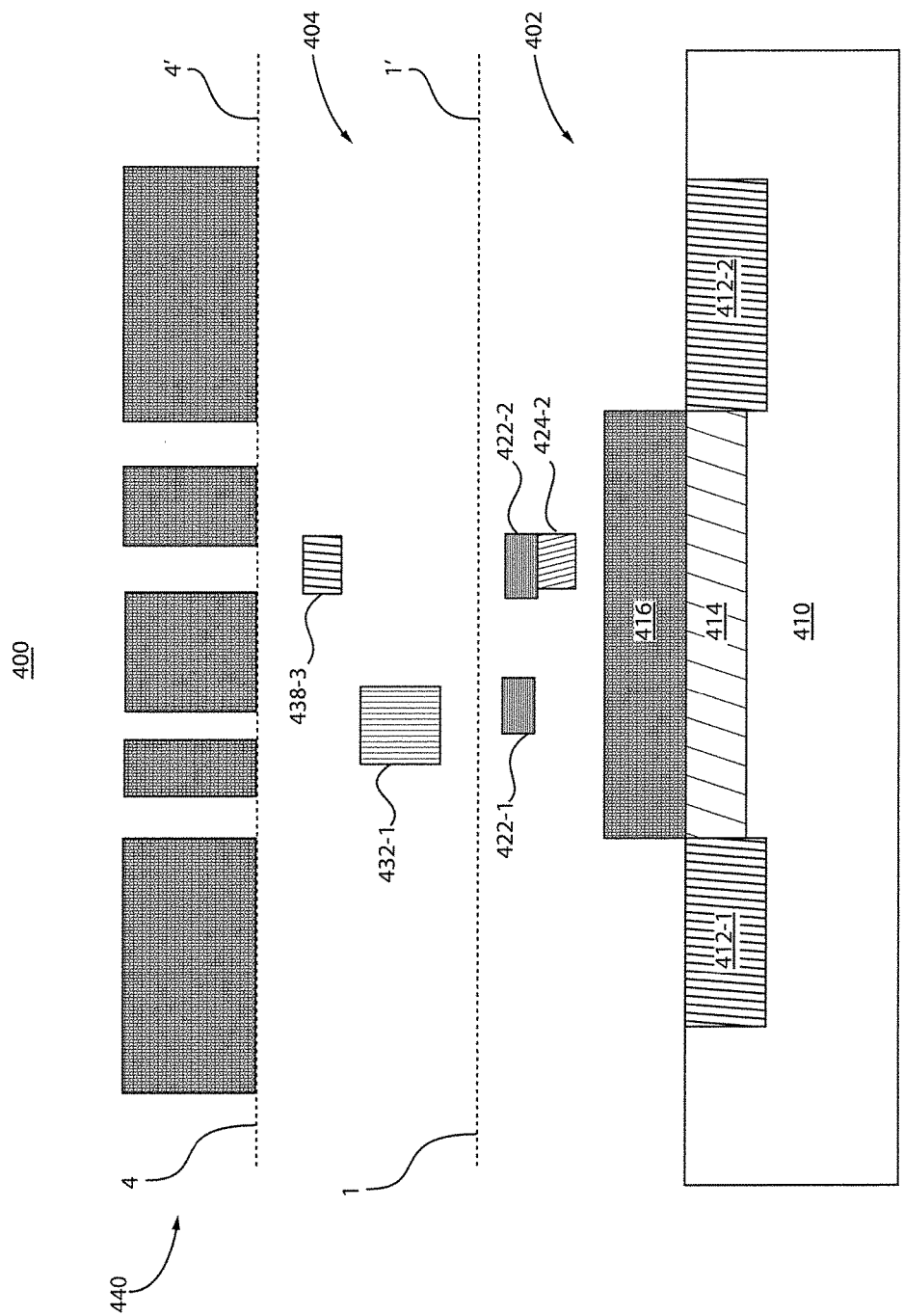
FIG. 8 is a cross-sectional view showing the fabrication of a semiconductor device, in accordance with an embodiment of the present invention.

With reference to FIG. 8, images 440 for vias are defined above the second tier 404. For example, as shown, the images 440 are defined on line 4-4', which is an imaginary line corresponding to a top of the second tier 404. In one embodiment, the images 440 are images for monolithic inter-tier vias (MIVs). MIVs are generally smaller than through-silicon vias (TSVs). Thus, employing MIVs as vias for 3D monolithic integration can achieve an integration density that is higher than employing TSVs.

Figure 9:
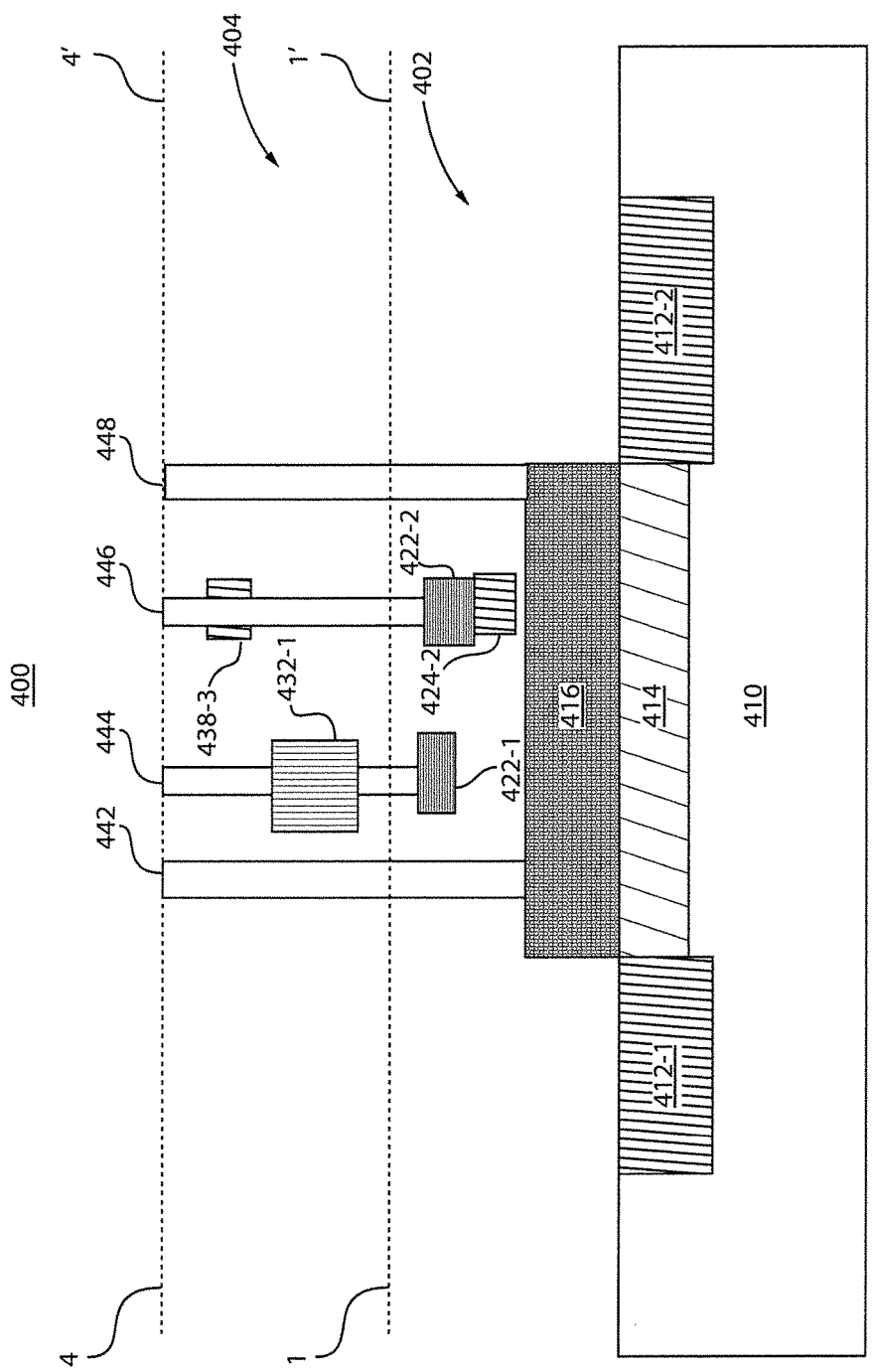
FIG. 9 is a cross-sectional view showing the fabrication of a semiconductor device, in accordance with an embodiment of the present invention.

With reference to FIG. 9, vias 442, 444, 446 and 448 are formed in accordance with the images 440. As shown, vias 442-448 are formed from the top of the second tier 404 (e.g., line 4-4') to respective positions within the first tier 402. In particular, via 442 is shown extending to the doped region 416, via 444 is shown extending to contact 422-1 through the doped region 432-1, via 446 is shown extending to contact 422-2 through contact 438-3, and via 448 is shown extending to the doped region 416. Vias 442-448 can be formed utilizing any method suitable for use in accordance with the embodiments described herein. For example, vias 442-448 can be formed utilizing one or more etching techniques. In one embodiment, vias 442-448 are simultaneously etched.

Vias 442-448 are associated with respective contacts of the device 400. For example, via 442 and 448 can be associated with a supply voltage contact, via 444 can be associated with a source/drain contact, via 446 can be associated with a gate contact. In one embodiment, vias 442 and 448 are shared with adjacent cells. Accordingly, there are three "types" of vias, with vias 442 and 448 being two instances of the same "type."

Although FIG. 9 illustratively depicts the vias 442-448 as high aspect ratio vias, it can be desirable to break the vias 442-448 up into stacked vias. This can be particularly advantageous in getting to the bottom tier 402 for VDD. Thus, additional layers and/or vias can be added in the bottom tier 402 and/or top tier 404 to achieve processing benefits. Furthermore, the vias 442-448 can penetrate through an epi or metal layer, or can be formed to only contact the side and top.

Figure 10:
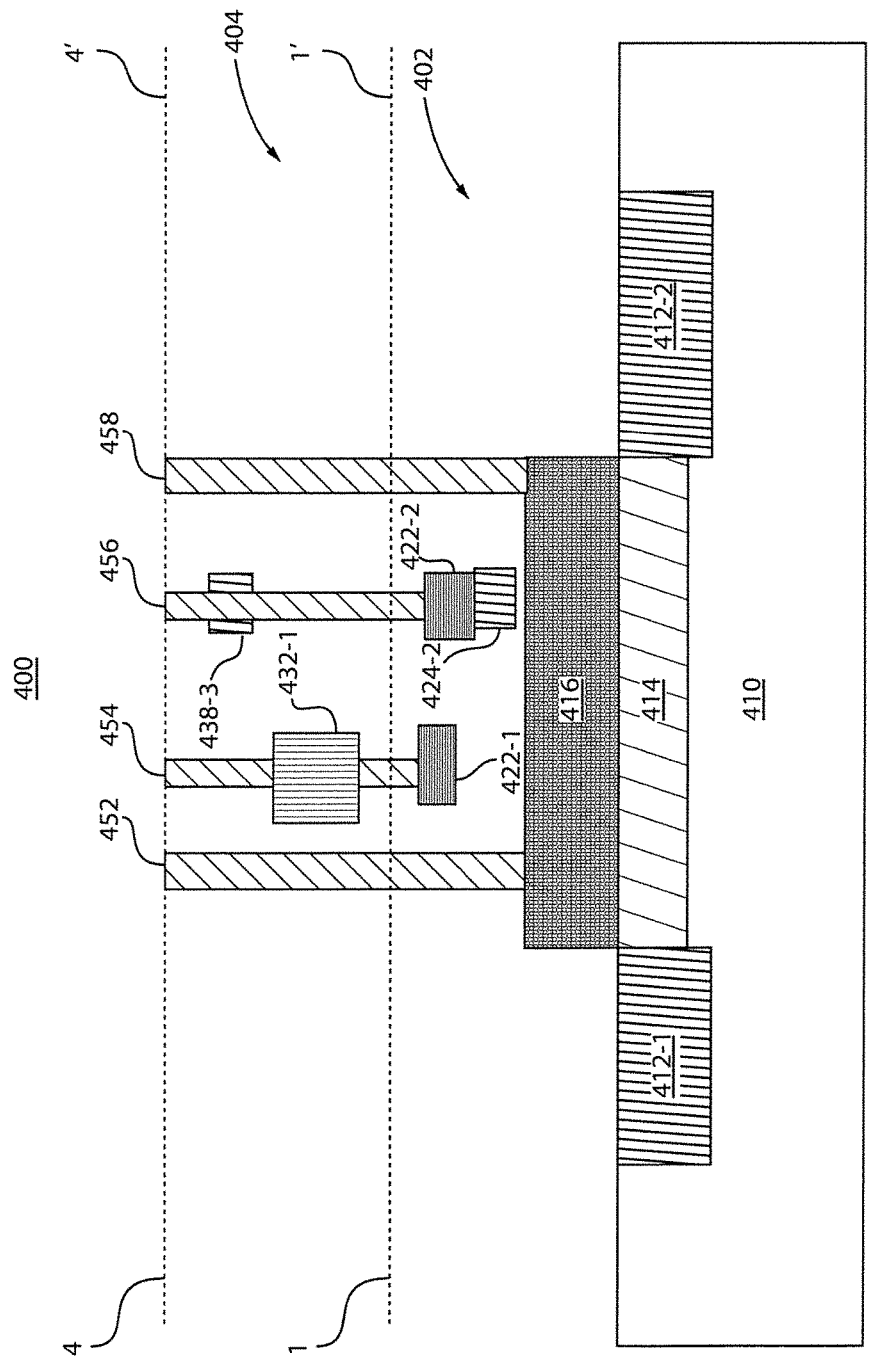
FIG. 10 is a cross-sectional view showing the fabrication of a semiconductor device, in accordance with an embodiment of the present invention.

With reference to FIG. 10, the vias 442-448 are filled to form respective interconnects 452-458. At least one of the interconnects penetrates and contacts the "bottom source" of the second tier and extends to the first tier, and at least one of the interconnects penetrates and contacts the gate of the second tier and extends to the first tier. The interconnects 452-458 may be formed by depositing a conductive material into vias 442-448 using any method suitable in accordance with the embodiments described herein. Vias 442-448 may be filled with any material suitable for use as interconnect material in accordance with the embodiments described herein. For example, the material could include tungsten, copper, cobalt, aluminum, silver, gold, etc. The interconnects 452-458 can further be polished.

Accordingly, interconnects 452-458 are formed from a top of the second tier 404 to respective positions within the first tier 402 by forming vias and filling the vias with interconnect material.

Figure 11:
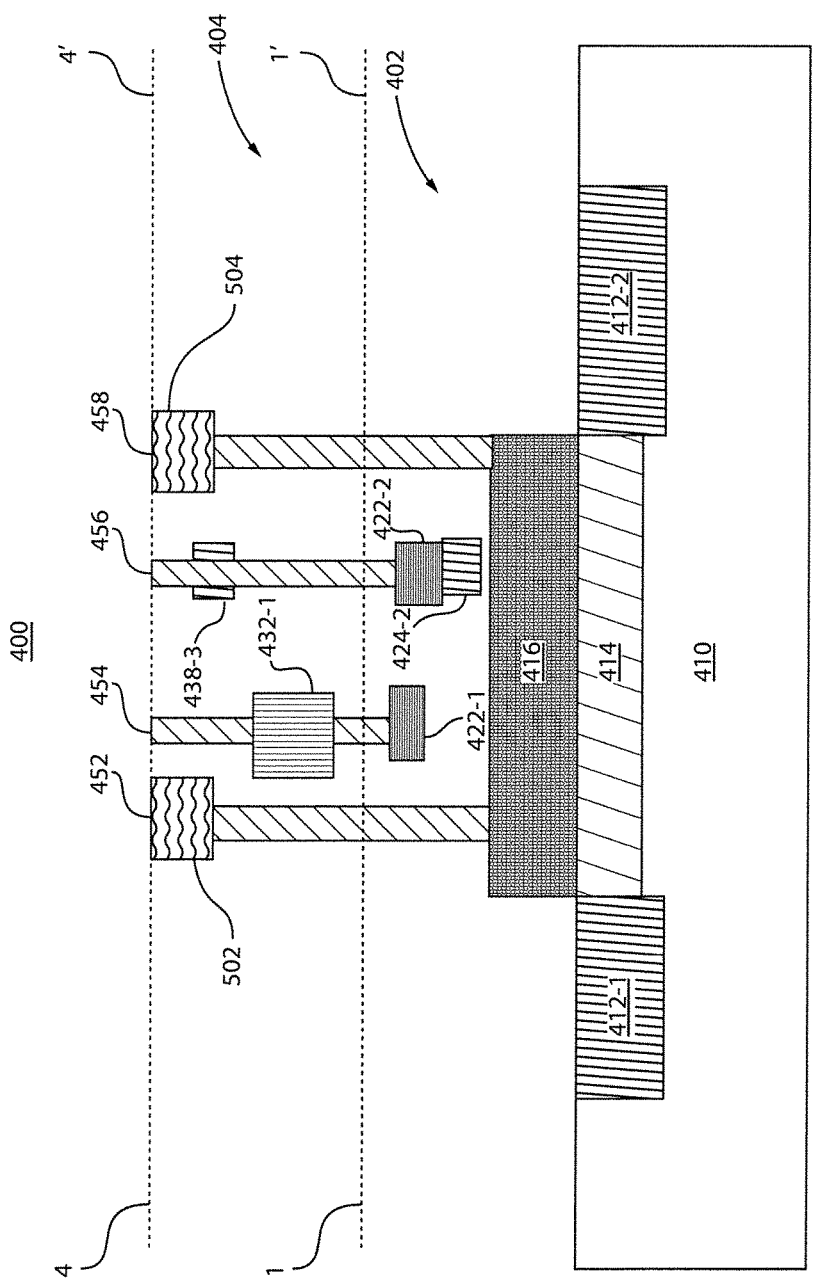
FIG. 11 is a cross-sectional view showing the fabrication of a semiconductor device, in accordance with an embodiment of the present invention.

FIG. 11 depicts the formation of the interconnects 452-458 in accordance with an alternative embodiment. To make the height of the vias more uniform, additional contacts can be formed. For example, contacts 502 and 504 can be formed as part of interconnects 452 and 458, respectively. To achieve this, the contacts 502 and 504 are formed by defining contact regions from a top of the top tier 404 prior to defining and forming the vias 442-448, and then the contacts 502 and 504 and vias 442-448 are filled with interconnect material. In one embodiment, the contacts 502 and 504 and the vias 442-448 are simultaneously filled.

Figure 12:
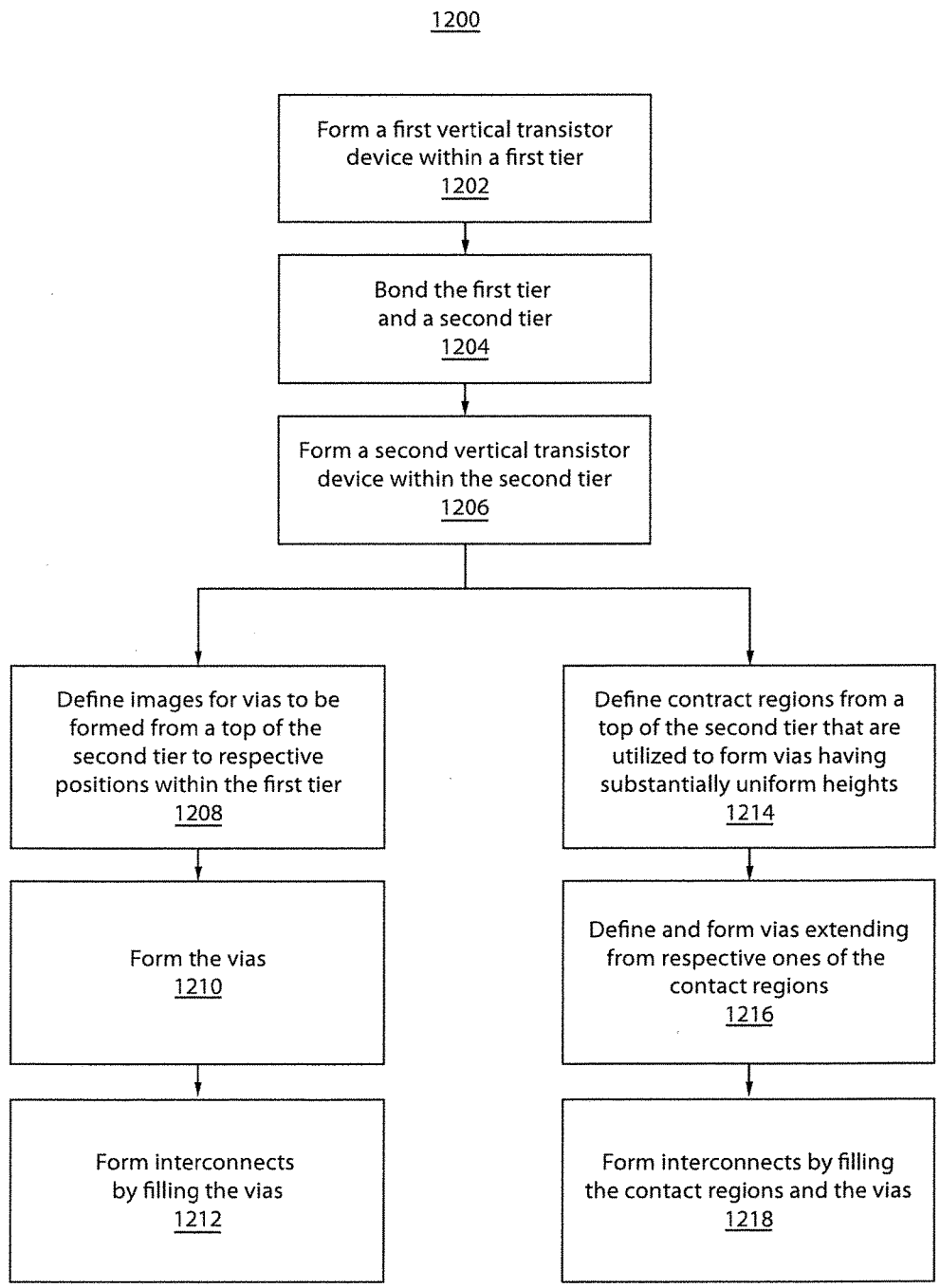
FIG. 12 is a block/flow diagram showing a system/method for fabricating a semiconductor device, in accordance with an embodiment of the present invention.

With reference to FIG. 12, a block/flow diagram 1200 is provided illustrating a process for fabricating a semiconductor device.

At block 1202, a first vertical transistor device associated with a first conductivity type is formed within a first tier.

At block 1204, the first tier and the second tier are bonded with a bonding layer. The bonding layer can be formed by depositing material suitable for use as bonding material, and planarizing the deposited material. For example, the material can be any dielectric material suitable for use in accordance with the embodiments described herein (e.g., silicon on oxide). A doped or undoped epitaxial layer can optionally be formed on the bonding layer prior to the first and second tier being bonded.

At block 1206, a second vertical transistor device associated with a second conductivity type is formed within a second tier. The first conductivity type can be p-type and the second conductivity type can be n-type, although such an arrangement is not limiting. In one embodiment, at least one of the first and second vertical transistor devices is a vertical FET device.

It is to be appreciated that blocks 1202-1206 can be performed in any order in accordance with the embodiments described herein.

The first and second vertical transistor devices are then connected to create a stacked vertical transistor device for three-dimensional monolithic integration. The stacked vertical transistor device can include a memory cell. For example, the memory cell can be an SRAM cell. Blocks 1208-1212 describe the connection in accordance with one embodiment.

At block 1208, images for vias to be formed from a top of the second tier to respective positions within the first tier are defined. The images can be defined in any suitable manner, and can be composed of any material suitable for implementation as image material for forming vias, in accordance with the embodiments described herein.

At block 1210, the vias are formed. The vias can include MIVs. The vias can be formed utilizing any techniques suitable for use in accordance with the embodiments described herein. For example, the vias may be forming utilizing one or more etching techniques. In one embodiment, the vias are simultaneously etched.

In one embodiment, the vias include a first via extending to a doped region of the first vertical transistor device, a second via extending to a first contact of the first vertical transistor device, and a third via extending to a second contact of the first vertical transistor device. In such an arrangement, the first via can be associated with a supply voltage, the second via can be associated with a source/drain contact in the second tier, and the third via can be associated with a gate contact in the second tier. In one embodiment, the first via is shared with adjacent cells.

At block 1212, interconnects are formed by filling the vias. The interconnects may be formed by depositing a conductive material into the vias using any method suitable in accordance with the embodiments described herein. The vias may be filled with any material suitable for use as interconnect material in accordance with the embodiments described herein. For example, the material could include tungsten, copper, cobalt, aluminum, silver, gold, etc.

Block 1214-1218 describe the formation of the interconnects in accordance with an alternative embodiment.

At block 1214, contact regions are defined from a top of the second tier. The contacts are utilized to form vias having substantially uniform heights. The contact regions can be defined in any suitable manner in accordance with the embodiments described herein.

At block 1216, vias extending from respective ones of the contact regions are defined and formed.

At block 1218, interconnects are formed by filling the contact regions and the vias. The interconnects may be formed by depositing a conductive material into the vias and contact regions using any method suitable in accordance with the embodiments described herein. The contact regions and vias may be filled with any material suitable for use as interconnect material in accordance with the embodiments described herein. For example, the material could include tungsten, copper, cobalt, aluminum, silver, gold, etc. In one embodiment, the contacts and the vias are simultaneously filled.

The interconnects formed in either of these illustrative embodiments can be polished after the contacts and/or vias are filled. At least one of the interconnects penetrates and contacts the "bottom source" of the second tier and extends to the first tier, and at least one of the interconnects penetrates and contacts the gate of the second tier and extends to the first tier.

Further details regarding blocks 1202-1218 are discussed herein above with reference to FIGS. 1-11.

Accordingly, a stacked vertical transistor device suitable for 3D monolithic integration is provided. The illustrative embodiments described herein provide for the formation of a stacked vertical FET device suitable for 3D monolithic integration in the fabrication of a memory cell, such as an SRAM cell. For example, an SRAM cell may be stacked with vertical FETs, with pFETs as load devices. However, in alternative embodiments, the nFETs can be load devices.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    forming a first vertical transistor device associated with a first conductivity type within a first tier;
    forming a second vertical transistor device associated with a second conductivity type within a second tier; and
    connecting the first vertical transistor device to the second vertical transistor device to create a stacked vertical transistor device for three-dimensional monolithic integration such that the first vertical transistor device is located below the second vertical transistor device within the stacked vertical transistor device;
    wherein connecting the first vertical transistor device to the second vertical transistor device includes forming interconnects from a top of the second tier to respective positions within the first tier by forming vias and filling the vias with interconnect material.

2. The method of claim 1, wherein at least one of the first and second vertical transistor devices includes a vertical field-effect transistor (FET).

3. The method of claim 1, wherein the first conductivity type is p-type and the second conductivity type is n-type.

4. The method of claim 1, wherein the first vertical transistor device includes four transistors and the second vertical transistor device includes two transistors.

5. The method of claim 4, wherein the stacked vertical transistor device is a six-transistor memory cell.

6. The method of claim 1, further comprising bonding the first and second tiers with a bonding layer.

7. The method of claim 1, wherein the vias include a first via extending to a doped region of the first vertical transistor device, a second via extending to a first contact of the first vertical transistor device, and a third via extending to a second contact of the first vertical transistor device device.

8. The method of claim 7, wherein the first via is associated with a supply voltage, the second via is associated with a source/drain contact in the second tier, and the third via is associated with a gate contact in the second tier.

9. The method of claim 1, wherein the vias include monolithic inter-level vias (MIVs).

10. The method of claim 1, further comprising defining images for the vias above the second tier prior to forming the vias.

11. The method of claim 1, wherein forming the interconnects further includes defining contact regions from a top of the second tier, forming the vias from respective ones of the contact regions, and filling the vias and the contact regions with interconnect material, and wherein the contact regions are utilized to form vias having substantially uniform heights.

12. A method for fabricating a semiconductor device, comprising:
    forming a first vertical field-effect transistor (FET) device associated with a first conductivity type within a first tier;
    forming a second vertical FET device associated with a second conductivity type within a second tier; and
    connecting the first vertical FET device to the second vertical FET device to create a stacked vertical FET device for three-dimensional monolithic integration such that the first vertical FET device is located below the second vertical FET device within the stacked vertical FET device;
    wherein connecting the first vertical FET device to the second vertical FET device includes forming interconnects from a top of the second tier to respective positions within the first tier by forming vias and filling the vias with interconnect material, the vias including a first via associated with a supply voltage extending to a doped region of the first vertical FET device, a second via associated with a source/drain contact in the second tier extending to a first contact of the first vertical FET device, and a third via associated with a gate contact in the second tier extending to a second contact of the first vertical FET device.

13. The method of claim 12, further comprising defining images for the vias above the second tier prior to forming the vias.

14. The method of claim 12, further comprising defining contacts from the top of the second tier prior to forming the vias, wherein the contacts are utilized to form vias having substantially uniform heights.

15. The method of claim 12, further comprising bonding the first and second tiers with a bonding layer.

16. A semiconductor device, comprising:
    a stacked vertical transistor device for three-dimensional monolithic integration, the stacked vertical transistor device comprising:
        a first vertical transistor device associated with a first conductivity type formed within a first tier;
        a second vertical transistor device associated with a second conductivity type formed within a second tier such that the first vertical transistor device is located below the second vertical transistor device;
        a bonding layer bonding the first and second tiers; and
        interconnects including vias filled with interconnect material formed from a top of the second tier to respective positions within the first tier connecting the first vertical transistor device to the second vertical transistor device.

17. The device of claim 16, wherein at least one of the first and second vertical transistor devices is a field-effect transistor (FET) device.

18. The device of claim 16, wherein the first conductivity type is p-type and the second conductivity type is n-type.

19. The device of claim 16, wherein the first vertical transistor device includes four transistors and the second vertical transistor device includes two transistors.

20. The device of claim 16, wherein the vias include a first via associated with a supply voltage extending to a doped region of the first vertical transistor device, a second via associated with a source/drain contact in the second tier extending to a first contact of the first vertical transistor device, and a third via associated with a gate contact in the second tier extending to a second contact of the first vertical transistor device.

* * * * *